US011828814B2

(12) United States Patent
Friese et al.

(10) Patent No.: US 11,828,814 B2
(45) Date of Patent: Nov. 28, 2023

(54) METHOD FOR DETECTING ELECTRICAL FAULT STATES IN A REMOVABLE BATTERY PACK AND SYSTEM FOR CARRYING OUT THE METHOD

(71) Applicant: Robert Bosch GmbH, Stuttgart (DE)

(72) Inventors: Andreas Friese, Pfalzgrafenweiler (DE); Christoph Klee, Stuttgart (DE); Marc-Alexandre Seibert, Stuttgart (DE); Mickael Segret, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 175 days.

(21) Appl. No.: 17/382,429

(22) Filed: Jul. 22, 2021

(65) Prior Publication Data
US 2022/0026503 A1 Jan. 27, 2022

(30) Foreign Application Priority Data
Jul. 24, 2020 (DE) .................... 10 2020 209 395.4

(51) Int. Cl.
*H02J 7/00* (2006.01)
*G01R 31/396* (2019.01)
*G01R 31/3835* (2019.01)

(52) U.S. Cl.
CPC ....... *G01R 31/396* (2019.01); *G01R 31/3835* (2019.01); *H02J 7/0013* (2013.01); *H02J 7/0031* (2013.01); *H02J 7/00032* (2020.01); *H02J 7/0047* (2013.01)

(58) Field of Classification Search
CPC ........................................................ H02J 7/00
See application file for complete search history.

(56) References Cited

U.S. PATENT DOCUMENTS

| 8,618,806 | B2 * | 12/2013 | Zhang | ............... | H01M 10/4207 |
| | | | | | 324/434 |
| 2013/0335013 | A1 | 12/2013 | Suzuki et al. | | |
| 2015/0295424 | A1 * | 10/2015 | Suzuki | ................. | H02J 7/0014 |
| | | | | | 320/116 |

FOREIGN PATENT DOCUMENTS

| DE | 10 2016 209 822 A1 | 12/2017 |
| WO | 2020/043386 A1 | 3/2020 |

* cited by examiner

*Primary Examiner* — Robert Grant
(74) *Attorney, Agent, or Firm* — Maginot, Moore & Beck LLP

(57) ABSTRACT

A method detects electrical fault states of a plurality of energy storage cells interconnected with one another in series and/or in parallel in a removable battery pack using a first monitoring unit integrated in the removable battery pack and a multiplexer measuring apparatus, which can be controlled by the first monitoring unit to sequentially measure cell voltages of the energy storage cells. A further monitoring unit sends a command to the first monitoring unit to control the multiplexer measuring apparatus, and is provided in an electrical device, in particular a charging device, a diagnostic device or an electrical consumer, that can be electrically connected to the removable battery pack.

9 Claims, 3 Drawing Sheets

METHOD FOR DETECTING ELECTRICAL FAULT STATES IN A REMOVABLE BATTERY PACK AND SYSTEM FOR CARRYING OUT THE METHOD

This application claims priority under 35 U.S.C. § 119 to patent application no. DE 10 2020 209 395.4, filed on Jul. 24, 2020 in Germany, the disclosure of which is incorporated herein by reference in its entirety.

The disclosure relates to a method for detecting electrical fault states of a plurality of energy storage cells interconnected with one another in series and/or in parallel in a removable battery pack by means of a first monitoring unit integrated in the removable battery pack and a multiplexer measuring apparatus, which can be controlled by the first monitoring unit to sequentially measure the cell voltages of the energy storage cells. The disclosure further relates to a system for carrying out the method.

BACKGROUND

A multiplicity of electrical consumers are operated using battery packs that can be removed without tools by the operator—referred to as removable battery packs in the following text—and that are discharged accordingly by the electrical consumer and can be recharged again by means of a charging device. Such removable battery packs usually consist of a plurality of energy storage cells interconnected in series and/or in parallel for achieving a requested removable battery pack voltage or capacity. If the energy storage cells are designed as lithium-ion cells (Li-ion), for example, a high power and energy density can particularly advantageously be achieved. On the other hand, to prevent electrical fault states, such cells also require compliance with strict specifications regarding the maximum charging and discharge current, the voltage and the temperature.

In modern removable battery packs, the cell voltage of the parallel-connected energy storage cells of what is known as a cell cluster is evaluated, for example, by a monitoring unit integrated in the removable battery pack, the monitoring unit controlling a multiplexer measurement apparatus to sequentially measure the cell voltages of the individual cell clusters that are connected in series. The term "cell voltage" should accordingly be understood not only as the voltage of an individual energy storage cell but also that of a cell cluster consisting of parallel-interconnected energy storage cells. So-called single cell monitoring (SCM) of this type is known, for example, from WO 20043386 A1, in which dangerous operation of the removable battery pack in the event of a fault is precluded by redundant monitoring.

In order for a charging device or an electrical consumer to know with which charging or discharge current a removable battery pack may be operated at a maximum, this is generally communicated by electrical coding, for example by coding resistors integrated in the removable battery pack that are measured by the electrical device and compared with a stored table, mechanical coding or a communication interface. DE 10 2016 209 822 A1 likewise discloses that the electrical device communicates to the removable battery pack that it may not continue to be used. The cell voltages can also be transmitted to the device via such an interface.

Proceeding from the prior art, it is the object of the disclosure to reliably detect any faults in a multiplexer measuring apparatus of a removable battery pack or software stored in a monitoring apparatus of the removable battery pack for controlling the multiplexer measuring apparatus.

SUMMARY

According to the disclosure, provision is made for a further monitoring unit, which in a method step of the method sends a command to the first monitoring unit to control the multiplexer measuring apparatus, to be provided in an electrical device, in particular a charging device, a diagnostic device or an electrical consumer, that can be electrically connected to the removable battery pack. A faulty behavior of the multiplexer measuring apparatus or the first monitoring unit controlling same can thus particularly advantageously be identified and an appropriate response thereto can be provided.

In the context of the disclosure, electrical consumers should be understood to mean, for example, power tools operated using a removable battery pack for performing work on workpieces by means of an electrically driven insert tool. The power tool may in this case be realized both as a hand-held power tool and as a floor-standing power tool. Typical power tools in this context are hand-held or floor-standing drills, screwdrivers, impact drills, hammer drills, planers, angle grinders, orbital sanders, polishing machines, circular, bench, miter and jig saws or the like. However, gardening appliances operated using a removable battery pack such as lawn mowers, lawn trimmers, pruning saws or the like and also domestic appliances operated using a removable battery pack such as vacuum cleaners, mixers, etc., may also be included under the term electrical consumer. The disclosure can likewise be applied to electrical consumers that are supplied with power using a plurality of removable battery packs at the same time.

The voltage of a removable battery pack is generally a multiple of the voltage of an individual energy storage cell and results from the interconnection (in parallel or in series) of the individual energy storage cells. An energy storage cell is typically designed as a galvanic cell, which has a structure in which one cell pole comes to lie at one end and a further cell pole comes to lie at an opposite end. In particular, the energy storage cell at one end has a positive cell pole and at an opposite end a negative cell pole. The energy storage cells are preferably designed as lithium-based energy storage cells, for example Li-ion, Li—Po, Li-metal and the like. However, the disclosure can also be applied to removable battery packs with Ni—Cd, Ni-MH cells or other suitable cell types. In current Li-ion energy storage cells with a cell voltage of 3.6 V, for example voltage classes of 3.6 V, 7.2 V, 10.8 V, 14.4 V, 18 V, 36 V etc. are produced. An energy storage cell is preferably designed as an at least substantially cylindrical round cell, wherein the cell poles are arranged at ends of the cylinder shape. However, the disclosure is not dependent on the type and construction of the energy storage cells used but can be applied to any removable battery packs and energy storage cells, for example also pouch cells or the like in addition to round cells.

It should furthermore be noted that the configuration of the electromechanical interfaces of the removable battery packs and the electrical devices that can be connected thereto and also the associated receptacles for force-fitting and/or form-fitting releasable connection are not intended to be the subject of this disclosure. A person skilled in the art will select a suitable embodiment for the interface depending on the power or voltage class of the electrical device and/or the removable battery pack. The embodiments shown in the drawings are therefore to be understood as purely exemplary. It is thus possible, in particular, to also use interfaces having more than the illustrated electrical contacts.

One embodiment of the disclosure makes provision for a plurality of switching elements, in particular transistors, to be provided in the removable battery pack, said switching elements each being connected in parallel with the energy storage cells to be measured, wherein the switching elements are closed sequentially in order to measure the individual cell voltages of the energy storage cells. The switching elements can also particularly advantageously be used to compensate for the states of charge of the individual energy storage cells, what is known as balancing, with the result that no additional components in the removable battery pack are necessary for the disclosure. This saves installation space and costs.

In another configuration of the disclosure, in a subsequent method step, the further monitoring unit requests the cell voltage of an energy storage cell measured by the first monitoring unit. The first monitoring unit subsequently transmits the measured cell voltage to the further monitoring unit, which for its part evaluates the measured cell voltage in a subsequent method step. These method steps are repeated for some or all other energy storage cells connected in series when no fault state has been detected. A repetition for all energy storage cells connected in series has the advantage that debalancing can inherently be prevented in this way.

A fault state is present when the ratio of the measured cell voltages is outside of a permissible operating range. The presently measured cell voltage transmitted to the further monitoring unit should thus be approximately 0 V, in particular less than 0.5 V, when the switching element is closed, whereas the individual cell voltages of the other energy storage cells in contrast have to have somewhat higher voltage values with a respectively open switching element. In the event of an identified fault state, the removable battery pack is deactivated in a subsequent method step in such a way that it may no longer receive and/or output energy. In this way, further damage to the removable battery pack or possibly to the electrical device can be prevented effectively. However, it is also conceivable that the charging or discharge current is reduced to the extent that emergency operation using the removable battery pack is still possible. As a result, it is made possible for the operator of an electrical device designed as an electrical consumer to complete his necessary work if there are no further removable battery packs present for immediate exchange.

Furthermore, provision can be made for the order of the measurements of the individual cell voltages to change from run-through to run-through. To this end, a corresponding table can be provided in the further monitoring unit of the electrical device, for example. As an alternative, however, the order can also be changed by a random number generator. A change to the order has the advantage that various energy storage cells or cell voltages can be used for fault identification before each charging or discharging process.

The disclosure also relates to a system comprising a removable battery back having a plurality of energy storage cells interconnected in series and/or in parallel, having a multiplexer measuring apparatus for sequentially measuring the cell voltages of the energy storage cells, having a first monitoring unit for controlling the multiplexer measuring apparatus and having a first electromechanical interface having a plurality of electrical contacts, and also an electrical device, in particular a charging device, a diagnostic device or an electrical consumer, having a further monitoring unit and having a further electromechanical interface having a plurality of electrical contacts, wherein in each case a first of the electrical contacts of the interfaces is designed as an energy supply contact that can be supplied with a first reference potential, preferably a supply potential, in each case a second of the electrical contacts of the interfaces is designed as an energy supply contact that can be supplied with a second reference potential, preferably a ground potential, and in each case at least one third of the electrical contacts of the interfaces is designed as a signal or data contact for the first and the further monitoring unit. The electrical contacts of the first and the further interface are connected to one another in order to carry out the method according to the disclosure.

BRIEF DESCRIPTION OF THE DRAWINGS

The disclosure is explained by way of example in the following text based on FIGS. 1 to 3, wherein identical reference signs in the figures indicate identical component parts with an identical function.

In the drawings.

DETAILED DESCRIPTION

Figure 1:
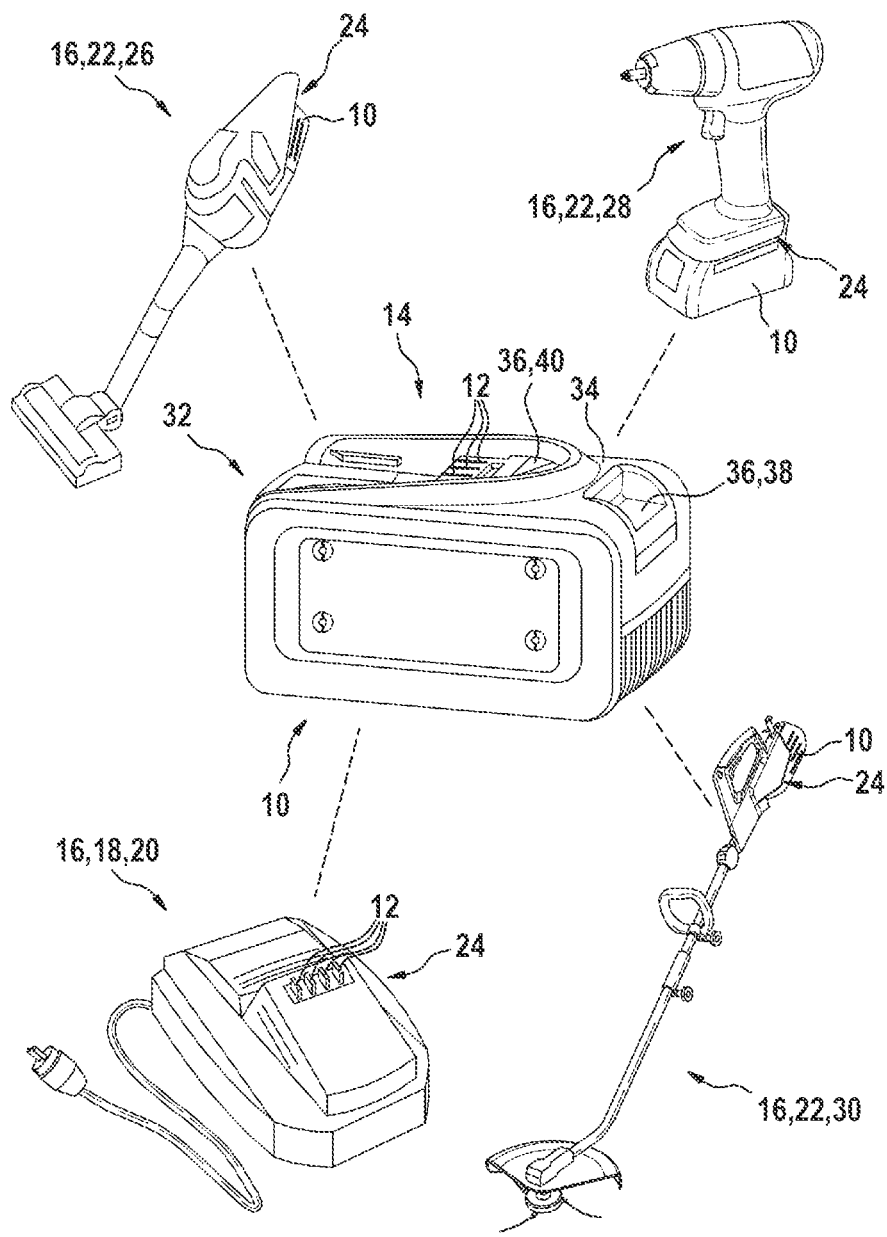
FIG. 1: shows a schematic illustration of a system comprising at least one removable battery pack and at least one electrical device that can be connected to the removable battery pack for charging or discharging the removable battery pack.

FIG. 1 shows a system comprising a removable battery pack 10 having a first electromechanical interface 14 having a plurality of electrical contacts 12 and an electrical device 16, in particular a charging device 18, a diagnostic device 20 or an electrical consumer 22, having a further electromechanical interface 24 having a plurality of electrical contacts 12. FIG. 1 is intended to illustrate that the system according to the disclosure is suitable for various electrical devices 16 operated using removable battery packs 10 without restricting the disclosure. In this case, a cordless vacuum cleaner 26, a cordless impact wrench 28 and a cordless lawn trimmer 30 are shown by way of example. In the context of the disclosure, however, a wide variety of power tools, gardening appliances and domestic appliances can be considered as electrical consumers 22. The number of removable battery packs 10 within the system can also be changed. The system can indeed also comprise several removable battery packs 10. It should furthermore be noted that, although in FIG. 1 the charging device 18 and the diagnostic device 20 are illustrated as one and the same electric device 16 because a charging device 18 can indeed also have a diagnostic function, it is conceivable, without restricting the disclosure, that the diagnostic device 20 does not have a charging function but serves only for pure diagnostics of the removable battery pack 10 for electrical fault states.

The removable battery pack 10 is essentially a conventional removable battery pack having a housing 32, which has on a first side wall or the top side 34 thereof the first electromechanical interface 14 for releasable connection to the electromechanical interface 24 of the electrical device 16. In connection with the electrical consumer 22, the first and the further electromechanical interface 14, 24 primarily serve to discharge the removable battery pack 10 while, in connection with the charging device 18, it serves to charge and, in connection with the diagnostic device 20, it serves for fault diagnosis of the removable battery pack 10. The precise configuration of the first and the further electromechanical interface 14, 24 is dependent on different factors, such as the voltage class of the removable battery pack 10 or the electrical device 16 and various manufacturer specifications, for example, It is thus possible to provide, for example, three or more electrical contacts 12 for energy and/or data transmission between the removable battery pack 10 and the electrical device 16. Mechanical coding is also conceivable, such that the removable battery pack 10 can be operated only at specific electrical devices 16. Since the mechanical configuration of the first electromechanical interface 14 of the removable battery pack and the further electromechanical interface 24 of the electrical device 16 is insignificant for the disclosure, this will not be dealt with in more detail here. Both the person skilled in the art and an operator of the removable battery pack 14 and the electrical device 16 will make the suitable selection in this regard.

The removable battery pack 10 has a mechanical arresting apparatus 36 for arresting the form-fitting and/or force-fitting detachable connection of the first electromechanical interface 14 of the removable battery pack 10 at the corresponding mating interface 24 (not shown in detail) of the electrical consumer 22. In this case, the arresting apparatus 36 is designed as a sprung pushbutton 38, which is operatively connected to an arresting member 40 of the removable battery pack 10. Due to the suspension of the pushbutton 38 and/or the arresting member 40, the arresting apparatus 36 automatically latches into the mating interface 24 of the electrical consumer 22 when the removable battery pack 10 is inserted. If an operator presses the pushbutton 38 in the insertion direction, the arresting system is released and the operator can remove or eject the removable battery pack 10 from the electrical consumer 22 counter to the insertion direction.

As already mentioned at the beginning, the battery voltage of the removable battery pack 10 usually results from a multiple of the individual voltages of the energy storage cells (not shown) depending on the interconnection (in parallel or in series). The energy storage cells are preferably designed as lithium-based battery cells, for example Li-ion, Li—Po, Li-metal and the like. However, the disclosure can also be applied to removable battery packs with Ni—Cd, Ni-MH cells or other suitable cell types.

Figure 2:
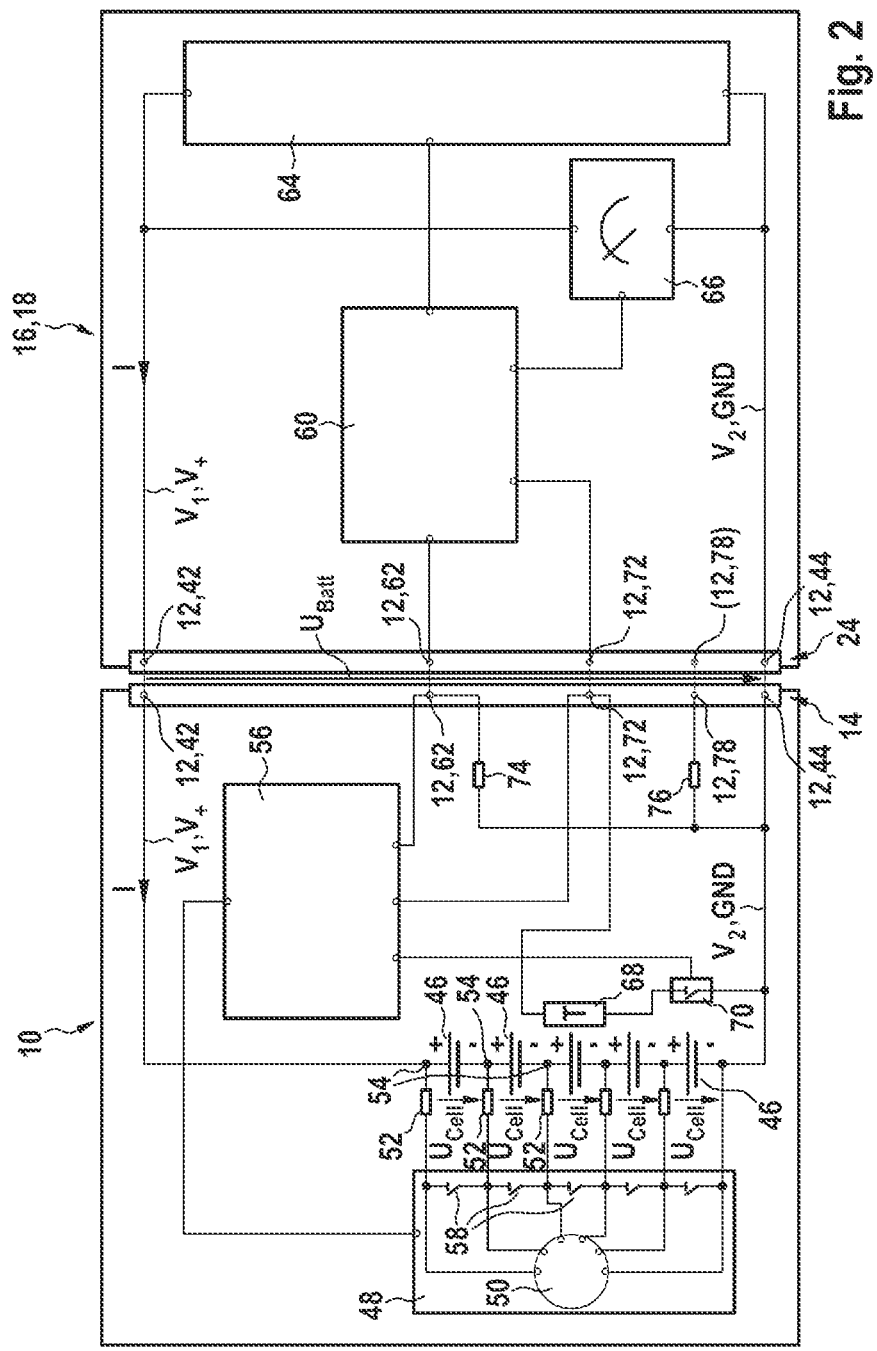
FIG. 2: shows the system from FIG. 1 as a block diagram with a removable battery pack and an electrical device designed as a charging device.

In FIG. 2, the system from FIG. 1 is illustrated in a block diagram with the removal battery pack 10 on the left-hand side and the electrical device 16 designed as a charging device 18 on the right-hand side. The removable battery pack 10 and the charging device 18 have the mutually corresponding electromechanical interfaces 14 and 24 having a plurality of electrical contacts 12, wherein in each case a first of the electrical contacts 12 of the interfaces 14, 24 serves as an energy supply contact 42 that can be supplied with a first reference potential $V_1$, preferably a supply potential $V_+$, and in each case a second of the electrical contacts 12 of the interfaces 14, 24 serves as an energy supply contact 44 that can be supplied with a second reference potential $V_2$, preferably a ground potential GND. On the one hand, the removable battery pack 10 can be charged by the charging device 18 via the first and the second energy supply contact 42, 44. On the other hand, discharge of the removable battery pack 10 is also effected via the same for the case that the electrical device 16 is designed as an electrical consumer 22. The term "can be supplied with" is intended to illustrate that the potentials $V_+$ and GND, in particular in the case of an electrical device 16 designed as an electrical consumer 22, are not permanently applied to the energy supply contacts 42, 44 but only after connection of the electrical interfaces 14, 24. The same applies for a discharged removable battery pack 10 after connection to the charging device 18.

The removable battery pack 10 has a plurality of energy storage cells 46, which, although they are illustrated in FIG. 2 as a series circuit, can alternatively or additionally also be operated in a parallel circuit, wherein the series circuit defines the voltage $U_{Batt}$ of the removable battery pack dropped across the energy supply contacts 42, 44, whereas a parallel circuit of individual energy storage cells 46 primarily increases the capacity of the removable battery pack 10. As already mentioned, individual cell clusters consisting of parallel-interconnected energy storage cells 46 can also be connected in series in order to achieve a specific voltage $U_{Batt}$ of the removable battery pack at the same time as an increased capacity. In current Li-ion energy storage cells 46 with a cell voltage $U_{Cell}$ of in each case 3.6 V, in the present exemplary embodiment a removable battery pack voltage $U_{Batt}=V_1-V_2$ of 5·3.6 V=18 V drops across the energy supply contacts 42, 44. Depending on the number of energy storage cells 46 connected in parallel in a cell cluster, the capacity of current removable battery packs 10 can be up to 12 Ah or more.

However, the disclosure is not dependent on the type, design, voltage, current-carrying ability, etc. of the energy storage cells 46 used, but instead can be applied to any removable battery packs 10 and energy storage cells 46.

To monitor the individual series-connected energy storage cells 46 or cell clusters of the removable battery pack 10, an SCM (single cell monitoring) preliminary stage 48 is provided. The SCM preliminary stage 48 has a multiplexer measuring apparatus 50, which can be connected in a high-impedance manner to corresponding taps 54 of the poles of the energy storage cells 46 or cell clusters via filter resistors 52. To detect the individual cell voltages $U_{Cell}$, the multiplexer measuring apparatus 50 switches over sequentially between the individual taps 54, for example by means of integrated transistors, which are not shown in more detail, in such a way that it is connected in each case to a positive and a negative pole of the energy storage cell 46 to be measured or the cell cluster to be measured. In the following text, the term energy storage cell is also intended to include the cell cluster, since these only influence the capacity of the removable battery pack 10, but are synonymous for detecting the cell voltages $U_{Cell}$. The filter resistors 52, which are configured, in particular, in a high-impedance manner, can prevent dangerous heating of the measuring inputs of the multiplexer measuring apparatus 50, in particular in the event of a fault.

The switchover of the multiplexer measuring apparatus 50 is effected by means of a first monitoring unit 56 integrated in the removable battery pack 10. Said monitoring unit can additionally close or open switching elements 58 of the SCM preliminary stage 48 that are connected in parallel with the energy storage cells 46 in order to effect what is known as balancing of the energy storage cells 46 to achieve uniform charging and discharging states of the individual energy storage cells 46. It is likewise conceivable that the SCM preliminary stage 48 passes the measured cell voltages $U_{Cell}$ directly through to the first monitoring unit 56 such that the actual measurement of the cell voltages $U_{Cell}$ is carried out directly by the first monitoring unit 56, for example by means of an appropriate analog-to-digital converter (ADC).

The first monitoring unit 56 can be designed as an integrated circuit in the form of a microprocessor, ASIC, DSP or the like. However, it is likewise conceivable that the monitoring unit 56 consists of a plurality of microprocessors or at least partly of discrete components with appropriate transistor logic. In addition, the first monitoring unit 56 can have a memory for storing operating parameters of the removable battery pack 10, such as, for example, the voltage $U_{Batt}$, the cell voltages $U_{Cell}$, a temperature T, a charging or discharge current I or the like.

In addition to the first monitoring unit 56 in the removable battery pack 10, the electrical device 16 of the system has a further monitoring unit 60, which can be designed correspondingly to the first monitoring unit 56. The first and the further monitoring unit 56 and 60, respectively, can exchange information, preferably digitally, via a third contact 12, designed as a signal or data contact 62, of the two electromechanical interfaces 14, 24.

The further monitoring unit 60 of the electrical device 16 designed as a charging device 18 controls a power output stage 64, which is connected to the first and the second energy supply contact 42, 44 of the further interface 24 and by means of which the removable battery pack 10 plugged into the charging device 18 can be charged using the charging current I and the voltage $U_{Batt}$ corresponding to the removable battery pack 10. For this purpose, the charging device 18 or the power output stage 64 is provided with a mains connection, which is not shown. The voltage $U_{Batt}$ applied to the energy supply contacts 42, 44 can be measured by means of a voltage measuring apparatus 66 in the charging device 18 and evaluated by the further monitoring unit 60. The voltage measuring apparatus 66 can also be integrated fully or partly in the monitoring unit 60, for example in the form of an integrated ADC.

A temperature T of the removable battery pack 10 or the energy storage cells 46 can be measured by means of a temperature sensor 68, which is arranged in the removable battery pack 10, is preferably designed as an NTC and is in close thermal contact with at least one of the energy storage cells 46, and evaluated by the further monitoring unit 60 of the charging device 18. To this end, the temperature sensor 68 is connected on one side to the second reference potential $V_2$, in particular to the ground potential GND, which is applied to the second energy supply contact 44 via a switching element 70, for example a bipolar transistor or MOSFET, which is integrated in the removable battery pack 10, and on the other side to a contact 12, designed as a signal or data contact 72, of the first interface 14 of the removable battery pack 10. A signal or data contact 72 is accordingly provided in the further interface 24 of the charging device 18, said contact being connected to the further monitoring unit 60. Furthermore, a connection exists between the signal or data contact 72 of the first interface 14 of the removable battery pack 10 and the first monitoring unit 56 of the removable battery pack 10. Via said connection, the first monitoring unit 56 can determine whether the temperature T measured by the temperature sensor 68 has been requested by the further monitoring unit 60 of the charging device 18. If this is the case, the first monitoring unit 56 is transferred automatically from a quiescent mode to an operating mode. If there has been no such request, the quiescent mode allows the first monitoring unit 56 significantly longer idle and storage times of the removal battery pack 10 due to the reduced quiescent current.

In order that the charging device 18 can identify the removable battery pack 10 and, if necessary, enable it for charging, the removable battery pack 10 has a first coding resistor 74, which is connected on one side to the second reference potential $V_2$, in particular to the ground potential GND, which is applied to the second energy supply contact 44 and on the other side to the third contact 12, designed as a signal or data contact 62, of the first interface 14 of the removable battery pack 10. If the resistance value of the first coding resistor 74 corresponds to a value stored in the further monitoring unit 56 of the charging device 60, the charging device 18 enables the charging process and charges the removable battery pack 10 according to the charging parameters stored in a look-up table, in particular the charging current I, the charging voltage $U_{Batt}$, the permissible temperature range, etc. In addition to the first coding resistor 74, a second coding resistor 76 is provided in the removable battery pack 10, said second coding resistor being connected, in a manner corresponding to the first coding resistor 74, to the second reference potential $V_2$ and a further contact 12, designed as a signal or data contact 78, of the first interface 14 of the removable battery pack 10. An electrical device 16 designed as an electrical consumer 22 can enable the discharge process of the removable battery pack 10 by means of the second coding resistor 76. To this end, analogously to the charging device 18, the electrical consumer 22 has a further monitoring unit 60, which requests the resistance value of the second coding resistor 76 by means of a contact 12, designed as a signal or data contact 78, of the further interface 24 and compares it with a stored value. If the values do not correspond, the discharging process of the removable battery pack 10 is terminated or not permitted, with the result that the electrical consumer 22 cannot be set into operation. When they correspond, an operator can set the electrical consumer 22 into operation. This advantageously allows operation of removable battery packs 10 of different power classes with identical electromechanical interfaces 14 or 24. It is self-evident that, in the case of an electrical consumer 22, the power output stage 64 contained in the charging device 18 is designed as a drive unit, for example as an electric motor (possibly with power output stage accordingly connected upstream) or another unit that consumes energy. The configuration of such a unit will not be dealt with further here since it is well known to a person skilled in the art for a wide variety of types of electrical consumers 22 and also does not have any critical importance for the disclosure.

Figure 3:
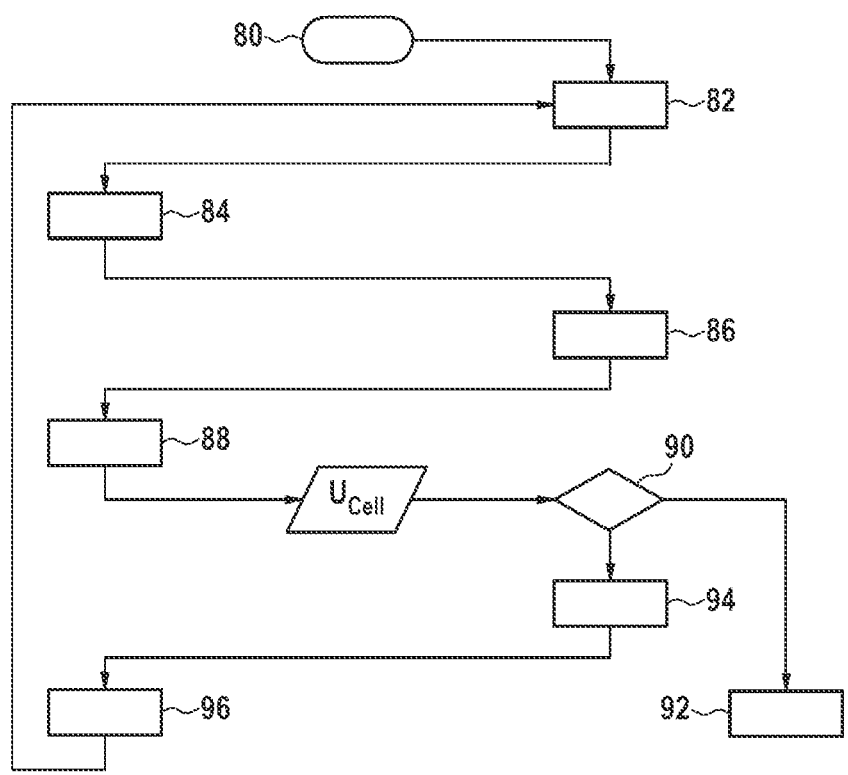
FIG. 3: shows a flowchart of the method according to the disclosure.

FIG. 3 shows a flowchart of the method according to the disclosure that can be carried out using the system described in FIG. 2. In a first method step 80 of the method, the removable battery pack 10 is connected via its first electromechanical interface 14 to the further electromechanical interface 24 of the electrical device 16. In the following text, it is to be assumed that the electrical device 16 is designed as a charging device 18 according to FIG. 2. However, the method can likewise be carried out using a system in which the electrical device 16 is designed as an electrical consumer 22 or as a diagnostic device 20.

For the purpose of better clarity, the method steps illustrated on the left-hand side of the flowchart are carried out in the removable battery pack 10 and the method steps illustrated on the right-hand side are carried out in the charging device 18.

In method step 82, first of all the further monitoring unit 60 of the charging device 18 sends a command to the first monitoring unit 56 of the removable battery pack 10 to close one of the switching elements 58 of the SCM preliminary stage 48. In the subsequent method step 84, the first monitoring unit 56 subsequently closes the corresponding switching element 58 and detects the corresponding cell voltage $U_{Cell}$ by means of the multiplexer measuring apparatus 50 and the associated filter resistors 52. Subsequently, in method step 86, the further monitoring unit 60 requests that the first monitoring unit 56 transmits the measured cell voltage $U_{Cell}$ to it in method step 88.

In method step 90, the further monitoring unit 60 evaluates the received cell voltage $U_{Cell}$, wherein this must be approximately 0 V, in particular less than 0.5 V, when the corresponding switching element 58 of the SCM preliminary stage 48 is closed, whereas in contrast the other cell voltages $U_{Cell}$ must be slightly increased when the switching elements 58 are correspondingly open. On account of the contact resistance between the P and N layer of a switching element 58 designed as a MOSFET or bipolar transistor, a voltage is generally dropped between the source and the drain or the collector and the emitter, with the result that the measured cell voltage $U_{Cell}$ is not exactly 0 V. If $U_{Cell}$ has a higher voltage value, the further monitoring unit 60 of the charging device 18 terminates the charging process in method step 92 and/or signals a fault state of the removable battery pack 10. As an alternative, the further monitoring device 60 can also reduce the charging current I in method step 92, instead of setting it to 0 A. A fault state is also present, in particular, when the ratio of the cell voltages $U_{Cell}$ evaluated by the further monitoring unit 60 is outside of a permissible operating range.

If the further monitoring unit 60 of the charging device 18 has determined in method step 90 that the received cell voltage $U_{Cell}$ has the expected value of approximately 0 V, preferably less than 0.5 V, while the individual cell voltages $U_{Cell}$ of the other energy storage cells 46 are significantly greater than 0 V, preferably greater than 0.5 V, with a respectively open switching element 58 or that the ratio of the cell voltages $U_{Cell}$ is within the permissible operating range, said further monitoring unit sends in method step 94 a command to the first monitoring unit 56 of the removable battery pack 10 to reopen the corresponding switching element 58 of the SCM preliminary stage 48.

In method step 96, the first monitoring unit 56 subsequently opens the switching element 58. As an alternative, method step 94 can also be omitted, with the result that the first monitoring unit 56 opens the switching element 58 in method step 96 of it's own accord after a determined period of time, for example after approximately 1 s. Following this, method steps 82 to 96 are repeated for the other cell voltages $U_{Cell}$ of the energy storage cells 46 or cell clusters to be measured. However, it is also possible to restrict the method to specific energy storage cells 46 virtually at random. For this purpose, the selection and order of the energy storage cells 46 or cell clusters to be monitored can be carried out by a table stored in the further monitoring unit 60 of the charging device or else by a random number generator and is particularly advantageously different from run-through to run-through. If all of the energy storage cells 46 or cell clusters that are connected in series are run through, this has the positive secondary effect that debalancing of the energy storage cells 46 or cell clusters is prevented.

Finally, it should be pointed out that the exemplary embodiments shown are not restricted either to FIGS. 1 to 3 nor to the number and type of removable battery packs 10 and electrical devices 16 shown therein. The same applies to the number of energy storage cells 46 and the associated configuration of the SCM preliminary stage 48. The configurations of the interfaces 14, 24 and the number of contacts 12 thereof shown should be understood as purely exemplary.

What is claimed is:

1. A method for detecting an electrical fault state of a plurality of energy storage cells interconnected with one another in series and/or in parallel in a removable battery pack, comprising:
  connecting a first electromechanical interface of the removable battery pack with a second electromechanical interface of a separate electrical device to electrically connect a first monitoring unit located in the removable battery pack to a second monitoring unit located in the electrical device;
  sequentially measuring cell voltages of energy storage cells of the plurality of energy storage cells with a multiplexer measuring apparatus operably connected to the plurality of energy storage cells and located in the removable battery pack;
  controlling the multiplexer measuring apparatus to sequentially measure the cell voltages using the first monitoring unit, the first monitoring unit operably connected to the multiplexer measuring apparatus; and
  sending a command to the first monitoring unit to control the multiplexer measuring apparatus from the second monitoring unit,
  wherein the removable battery pack is removable from the electrical device by disconnecting the first electromechanical interface from the second electromechanical interface.

2. The method according to claim 1, further comprising:
  sequentially closing switching elements of a plurality of switching elements in order to sequentially measure the cell voltages of the energy storage cells, the plurality of switching elements included in the removable battery pack, and the switching elements each connected in parallel with the energy storage cells.

3. The method according to claim 2, further comprising:
  requesting, with the second monitoring unit, the measured cell voltage of an energy storage cell measured using the first monitoring unit with a request sent through the first electromechanical interface and the second electromechanical interface.

4. The method according to claim 3, further comprising:
  transmitting, using the first monitoring unit, the requested cell voltage through the first electromechanical interface and the second electromechanical interface to the second monitoring unit.

5. The method according to claim 4, further comprising:
  evaluating, using the second monitoring unit, the transmitted cell voltage; and
  evaluating the cell voltages of each other energy storage cell when a no fault state has been detected using the second monitoring unit.

6. The method according to claim 1, further comprising:
  detecting the electrical fault state when a ratio of the measured cell voltages is outside of a permissible operating range; and
  deactivating the removable battery pack when the electrical fault state is detected, such that the removable battery pack no longer receives and/or outputs energy.

7. The method according to claim 5, further comprising:
  detecting the no fault state when the cell voltage of a measured energy storage cell transmitted to the second monitoring unit is less than 0.5 V when the corresponding switching element is closed, and the cell voltages of the other energy storage cells have higher voltage values with a respectively open corresponding switching element.

8. The method according to claim 1, wherein sequentially measuring the cell voltages comprises:

sequentially measuring the cell voltages of each energy storage cell of the plurality of energy storage cells in a first order of measurement; and changing to a different order of measurement of the cell voltages of each of the plurality of energy storage cells after each sequential measurement of the cell voltages.

9. A system comprising:

a removable battery pack including (i) a plurality of energy storage cells interconnected in series and/or in parallel, (ii) a multiplexer measuring apparatus configured to sequentially measure cell voltages of the energy storage cells, (iii) a first monitoring unit configured to control the multiplexer measuring apparatus, and (iv) a first electromechanical interface including a first plurality of electrical contacts; and an electrical device including a second monitoring unit and a second electromechanical interface having a second plurality of electrical contacts, wherein in each of the first and the second plurality of electrical contacts (i) a first electrical contact is configured as an energy supply contact that can be supplied with a first reference potential, (ii) a second electrical contact is configured as an energy supply contact that can be supplied with a second reference potential, and (iii) at least one third electrical contact is configured as a signal or data contact for the first and the second monitoring units, and wherein the system is configured to detect an electrical fault state of the plurality of energy storage cells, the system configured to:

control the multiplexer measuring apparatus to sequentially measure the cell voltages using the first monitoring unit; and send a command to the first monitoring unit to control the multiplexer measuring apparatus from the second monitoring unit.

\* \* \* \* \*